June 7, 1966 J. Y. MA 3,254,539

FINE TUNER

Filed Sept. 5, 1963

Inventor:
John Y. Ma

By: Hofgren, Wegner, Allen, Stellman & McCord
Attorneys

United States Patent Office 3,254,539

Patented June 7, 1966

3,254,539
FINE TUNER
John Y. Ma, Algonquin, Ill., assignor to Oak Manufacturing Co., a corporation of Delaware
Filed Sept. 5, 1963, Ser. No. 306,912
1 Claim. (Cl. 74—10)

This invention relates in general to a preset fine tuner, as for use in a television set.

More particularly, this invention relates to an improved television tuner wherein a channel selector shaft and a fine tuning shaft are provided on a single chassis. Such arrangements are generally known in the art, however known devices have not provided a satisfactory tuner wherein it is possible to change channels without altering the fine tuning setting of the channels. In known devices relatively complex mechanisms are utilized to prevent actuation of the fine tuning means during operation of the channel selection means.

The general purpose of the present invention is to provide an improved and simplified television tuning device which allows channels to be changed without altering the fine tuning setting of the channels.

A more specific object of the present invention is the provision of a television channel selector and fine tuning device having a chassis, a channel selector shaft rotatably mounted on the chassis for selecting any one of a plurality of channels, a plurality of fine tuning adjusting screws threadably mounted concentrically about the fine tuning shaft for rotation therewith and each having a gear head, one screw corresponding to each channel for fine tuning of the respective channel, and a fine tuning shaft carrying a driving gear mating with gearing associated with said chassis for operating the gear head of the screw corresponding to a selected channel, said gearing being so constructed and arranged that the tuning of the channel selector shaft will not disturb the setting of the fine tuning screws.

Other objects and advantages of the invention will become more readily apparent from the following detailed description taken in connection with the accompanying drawing, wherein.

Figures 1, 2, 3, 4, 5, 6, 7, 8:
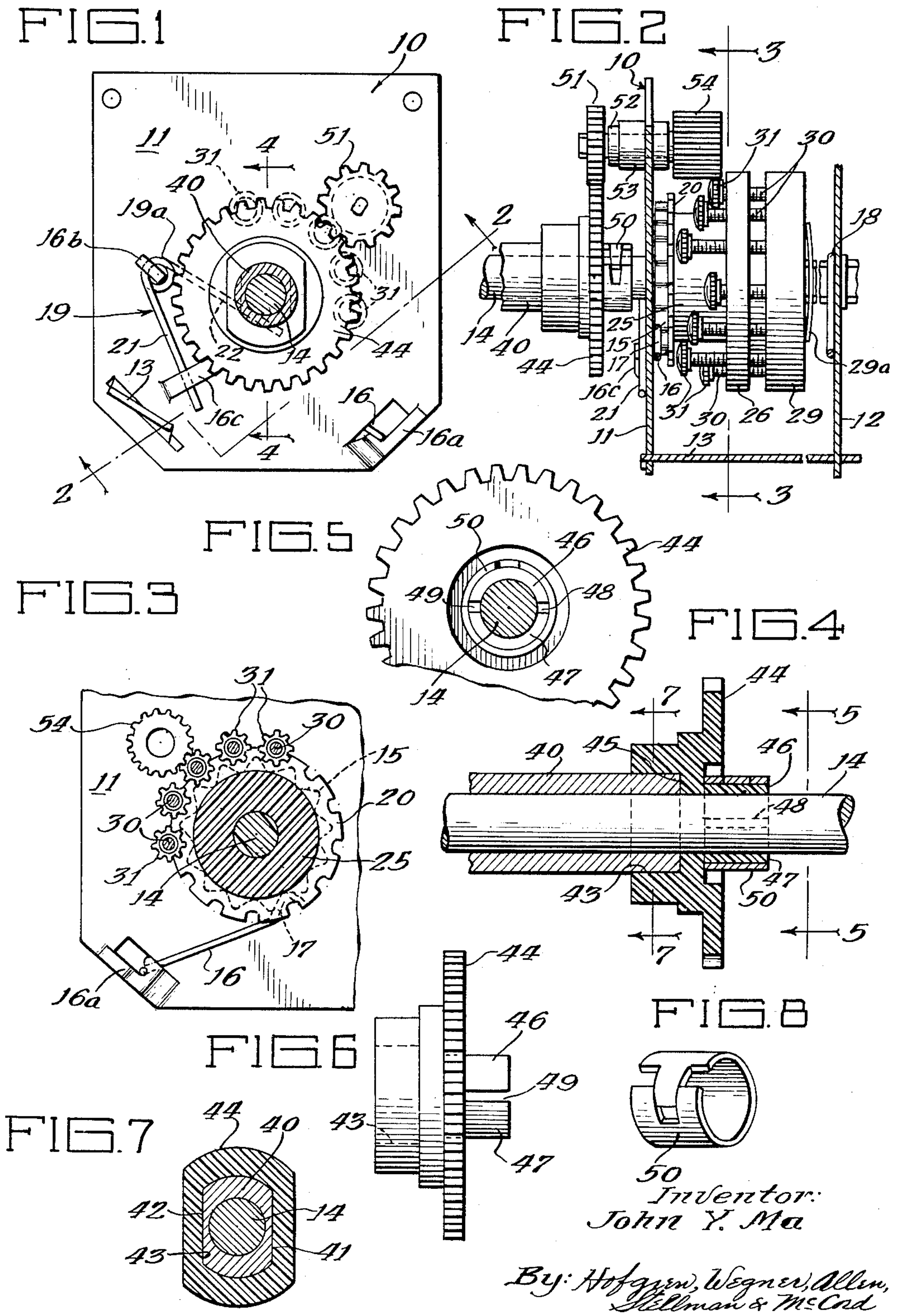
FIGURE 1 is a front elevational view of a preferred embodiment of the invention.
FIGURE 2 is a sectional view taken substantially as shown along the line 2—2 of FIGURE 1.
FIGURE 3 is a sectional view taken substantially as shown along the line 3—3 of FIGURE 2.
FIGURE 4 is a sectional view taken substantially as shown along line 4—4 of FIGURE 1 with certain parts broken away for clarity.
FIGURE 5 is a sectional view taken substantially as shown along line 5—5 of FIGURE 4.
FIGURE 6 is a side elevational view of a gear member of the present invention.
FIGURE 7 is a sectional view taken substantially as shown along line 7—7 of FIGURE 6.
FIGURE 8 is a perspective view of one element of the present invention.

While an illustrative embodiment of the invention is shown in the drawings and will be described in detail herein, the invention is susceptible to embodiment in many different forms, and it should be understood that the present disclosure is to be considered as an exemplification of the principles of the invention and is not intended to limit the invention to the embodiment illustrated. The scope of the invention will be pointed out in the appended claims.

Referring now to the drawings, wherein like reference characters designate like or corresponding parts throughout the several views, the combined television channel selector and fine tuning device includes a chassis 10 on which is mounted the channel selector mechanism and the fine tuning mechanism. In the illustrated embodiment, chassis 10 has a generally vertical front wall 11 and a second wall 12 spaced from and parallel to front wall 11. Walls 11 and 12 are rigidly interconnected in a suitable manner, as by longitudinally extending members, such as that shown at 13. The channel selector mechanism includes a channel selector shaft 14 journalled in walls 11 and 12, with a front end portion of the shaft extending outwardly from the front wall 11 and adapted to receive a suitable knob, not shown, for rotating the shaft in either direction and operating channel selector components, not shown, connected with a rear portion of the shaft in any suitable manner. These components may be mounted on chassis 10 if desired.

An index disc 15 is fixedly mounted on shaft 14, immediately inwardly of chassis front wall 11. A generally U-shaped torsion spring 16 is suitably mounted on chassis 10, as by a recessed hook portion **16*a*. Spring 16 has a detent portion 17 on one leg thereof selectively received in any one of a plurality of circumferentially disposed notches in index plate 15, so that channel selector shaft 14 may be rotated step by step in a predetermined manner, each step corresponding to the setting for one of the channels. The free end of the other leg of spring 16 has a generally hook-shaped portion 18, received in a circumferential groove in shaft 14 immediately inwardly of wall 12, thus holding shaft 14 against axial movement rearwardly of chassis 10, and retaining spring 16 and detent 17 resiliently urged into one of the index plate notches. A plate 20 is secured on shaft 14 against index plate 15 and extends outwardly from the periphery of the index plate 15 to define, with front wall 11, a channel for retaining detent 17 in the appropriate index plate notch. A general V-shaped spring 19 is suitably mounted on wall 11, as by having eye portion 19*a* hooked upon an upwardly bent detent 16*b*. One leg 21 of spring 19 engages a second upwardly bent detent 16*c*, and the other leg 22 engages a suitable groove provided in shaft 14 adjacent wall 11, to retain shaft 14 against movement forwardly of the chassis. The end 18 of spring 16 which contacts the switch shaft groove at the wall 12** also serves as an electrical ground.

The fine tuning mechanism includes a rotor support 25 mounted on shaft 14 adjacent plate 20 by any suitable means, such as that set forth in detail in copending application, Serial No. 204,182 having the same assignee as the present application. A rotor 29 is secured to rotor support 25 for rotation with shaft 14 by means also set forth in detail in the above mentioned copending patent application. Rotor 29 is held against axial movement rearwardly on shaft 14 by a suitable spring clip **29*a* held on shaft 14 and seated against the base of rotor 29**.

Channel tuning components such as inductors and capacitors, not shown, are provided in the tuner for each of the channels. Fine tuning inductors in the oscillator circuit for each channel are responsive to axial movement of adjusting members, here in the form of screws 30, threadably mounted in a flange 26 of rotor support 25 for movement in a direction generally parallel to the axis of shaft 14. Each adjusting screw 30 has a gear head 31 for rotating the respective screw and threading it back and forth in flange 26.

The fine tuning mechanism further includes a fine tuning shaft 40 telescoped on channel selector shaft 14 for rotation independently of the channel selector shaft. Fine tuning shaft 40 may be retained against longitudinal movement forwardly of shaft 14 in any suitable manner, as by C-washer, in a circumferential groove, not shown, in shaft 14 adjacent the forward end portion of shaft 40. As is best seen in FIGURE 7, the rearwardly extending end of shaft 40 is provided with opposed flat faces 41 and 42 which are received in a complementarily shaped bore 43 of a drive gear 44. As is seen in FIGURE 4, the end of shaft 40 is seated against the bottom 45 of bore 43. Gear member 44 further includes an axially extending sleeve formed of two opposed arcuate sleeve sections 46 and 47 spaced by appropriate notches 48 and 49. Gear member 44 is formed of a smooth plastic bearing material, and accordingly is rotatable with fine tuning shaft 40 independently of channel selector shaft 14. A band 50 of resilient material is positioned around sleeve sections 46 and 47, and compresses the sleeve sections with sufficient force so that gear member 44 is affixed to shaft 14 for rotation therewith. However, the compressive force of band 50 is not sufficient to rotate shaft 14 when shaft 40 is rotated independently of shaft 14, and thus slip clutch means are defined.

A pinion 51 is fixedly secured to one end of a gear shaft 52 and constantly meshes with drive gear 44. Gear shaft 52 is rotatably mounted in a bushing 53 that is fixed in a suitable aperture in front plate 11, and the gear shaft is provided with an elongated gear 54 at the other end thereof, which meshes with the gear head 31 of the adjusting screw 30 corresponding to the selected channel. Gear 54 is sufficiently long to be in constant engagement with the appropriate gear head 31 regardless of the longitudinally adjusted position of the gear head.

When shaft 14 is rotated to select a particular channel, gear 54 rotates in the opposite direction through gears 44 and 51. Rotor support 25 and gear heads 31 supported thereon rotate with shaft 14. The pitch circle of each gear head 31 is tangential to the pitch circle of gear 44 (FIGURE 1), so that as gear 44 rotates with shaft 14, there will be no relative movement between gear 54 and the adjacent gear head 31 at the point of engagement and thus no fine tuning action will take place during the changing of channels.

From the foregoing, it will be appreciated that a television tuner has been provided wherein the fine tuning control means (gear 54 and a gear head 31) is in constant driving engagement. It should also be apparent that shaft 14 may be rotated to change channels without driving a gear head 31, and thus the fine tuning settings will not be altered during the changing of channels. The present invention achieves these results in a simple yet novel manner, and obviates the necessity of providing a complex mechanism to prevent the actuation of the fine tuning means during channel selection.

I claim:

A television channel selecting and fine tuning device comprising: a chassis; a channel selector shaft rotatably mounted on said chassis for operation to various selected channel positions; a driving member on said shaft for rotation therewith independently of said seselector shaft and rotatable independently thereof; means positively keying said driving member to said fine tuning shaft for rotation therewith independently of said selector shaft; a support mounted on said selector shaft for rotation therewith; fine tuning members concentric about said selector shaft and movable axially in said support, one member corresponding to each channel position; actuating means rotatable at a fixed position on said chassis for adjusting said fine tuning members, said actuating means being in driving engagement with said driving member and with one of said fine tuning members and operated by said driving member upon independent rotation of said fine tuning shaft to adjust said fine tuning members; an axially extending hub on said driving member, said hub being formed by a plurality of compressible hub sections each having a surface curved to embrace said channel selector shaft; and slip clutch means binding said driving member to said selector shaft, and including a resiliently compressive spring sleeve member surrounding said hub sections and exerting a radially inwardly directed force of sufficient magnitude to bind said driving member to said channel selecting shaft for rotation therewith, the force of said compressive member being lower in magnitude than the force provided by the positive keying of said fine tuning shaft to said driving member whereby said fine tuning shaft can rotate said driving member relative to said channel selector shaft.

References Cited by the Examiner

UNITED STATES PATENTS

| | | | |
|---|---|---|---|
| 2,136,160 | 11/1938 | Tinnerman | 287—53 |
| 2,291,944 | 8/1942 | Bonanno | 287—53 |
| 3,090,932 | 5/1963 | Torrence | 74—10.45 X |
| 3,150,338 | 9/1964 | Weiner | 74—10.41 X |

MILTON KAUFMAN, *Primary Examiner.*